(12) United States Patent
Tang et al.

(10) Patent No.: US 11,494,016 B2
(45) Date of Patent: Nov. 8, 2022

(54) TOUCH INTEGRATED DISPLAY DEVICE

(71) Applicant: Novatek Microelectronics Corp., Hsinchu (TW)

(72) Inventors: Yu-Ying Tang, Taoyuan (TW); Ching-Yang Pai, Taipei (TW); Chih-Chang Lai, Taichung (TW)

(73) Assignee: Novatek Microelectronics Corp., Hsinchu (TW)

( * ) Notice: Subject to any disclaimer, the term of this patent is extended or adjusted under 35 U.S.C. 154(b) by 17 days.

(21) Appl. No.: 17/145,408

(22) Filed: Jan. 11, 2021

(65) Prior Publication Data

US 2021/0278920 A1    Sep. 9, 2021

Related U.S. Application Data

(60) Provisional application No. 63/003,255, filed on Mar. 31, 2020, provisional application No. 62/978,831, filed on Feb. 20, 2020.

(51) Int. Cl.
| | |
|---|---|
| *G06F 3/041* | (2006.01) |
| *G06F 3/044* | (2006.01) |
| *H01L 27/32* | (2006.01) |
| *H01L 51/52* | (2006.01) |

(52) U.S. Cl.
CPC .......... *G06F 3/0412* (2013.01); *G06F 3/0443* (2019.05); *G06F 3/0446* (2019.05); *H01L 27/323* (2013.01); *H01L 27/3244* (2013.01); *H01L 51/5253* (2013.01); *G06F 2203/04107* (2013.01)

(58) Field of Classification Search
CPC .... G06F 3/0412; G06F 3/0446; G06F 3/0443; H01L 27/323; H01L 27/3244; H01L 51/5253

USPC .................................................. 345/173–174
See application file for complete search history.

(56) References Cited

U.S. PATENT DOCUMENTS

| | | | |
|---|---|---|---|
| 10,608,057 B2 | 3/2020 | Sim et al. | |
| 2016/0328051 A1* | 11/2016 | Shishido | G06F 3/04164 |
| 2018/0033979 A1* | 2/2018 | Jang | B32B 9/041 |

(Continued)

FOREIGN PATENT DOCUMENTS

| | | | |
|---|---|---|---|
| CN | 108091669 | 5/2018 | |
| EP | 3163419 A1 * | 5/2017 | ......... G02F 1/13338 |
| TW | 201537408 | 10/2015 | |

OTHER PUBLICATIONS

"Office Action of Taiwan Counterpart Application", dated Nov. 12, 2021, p. 1-p. 12.

*Primary Examiner* — Kwin Xie
(74) *Attorney, Agent, or Firm* — JCIPRNET

(57) ABSTRACT

A touch integrated display device includes a substrate, at one metal layer, a touch sensor and trace layer, and a shielding layer. The substrate includes an active area and a fan out area neighbouring to the active area. The metal layer is disposed over the substrate in the active area, extended to the fan out area and includes a plurality of source lines and a plurality of gate lines. The touch sensor and trace layer is disposed over the metal layer in the active area and extended to the fan out area. The shielding layer is at least disposed at an overlap region of the fan out area where the metal layer and the touch sensor and trace layer are overlapped from a top view to shield electromagnetic interference between the metal layer and the touch sensor and trace layer.

27 Claims, 6 Drawing Sheets

(56) References Cited

U.S. PATENT DOCUMENTS

| | | |
|---|---|---|
| 2018/0145114 A1 | 5/2018 | Sim et al. |
| 2018/0374912 A1* | 12/2018 | Zhang .................. G06F 3/0412 |
| 2019/0204952 A1* | 7/2019 | Han ....................... G06F 3/044 |
| 2020/0027929 A1* | 1/2020 | Lee ....................... G06F 3/0446 |

* cited by examiner

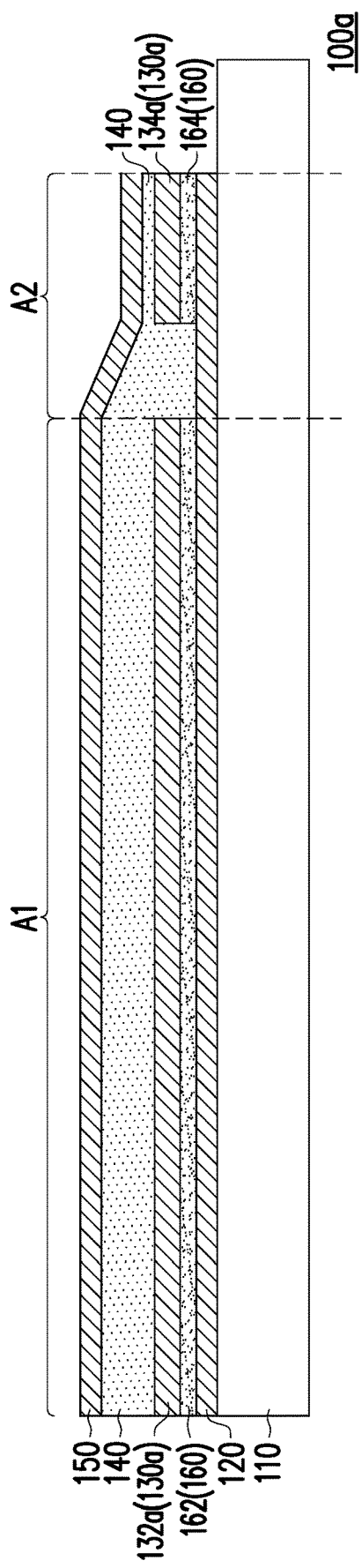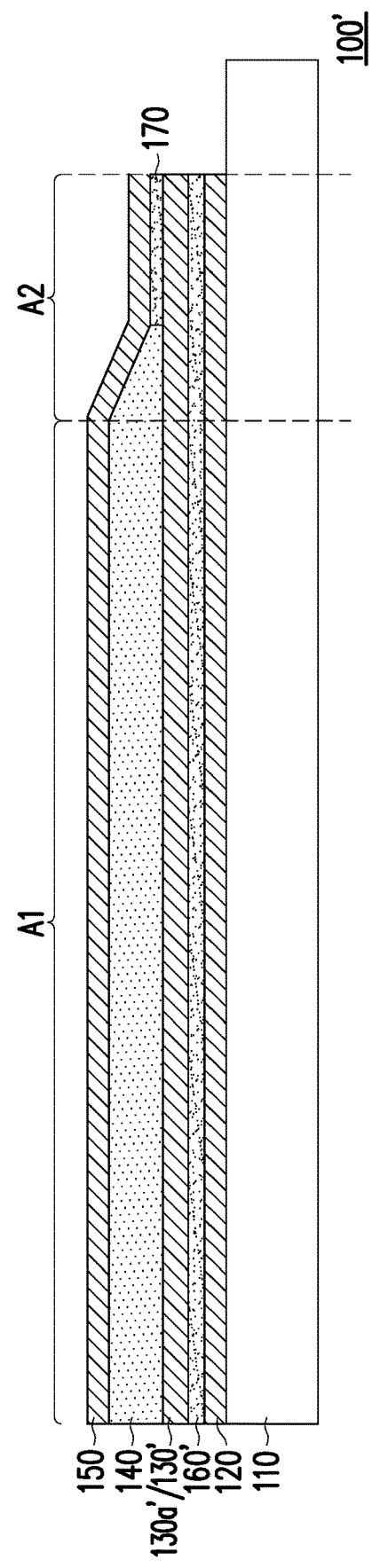

TOUCH INTEGRATED DISPLAY DEVICE

CROSS-REFERENCE TO RELATED APPLICATION

This application claims the priority benefit of U.S. provisional applications Ser. No. 62/978,831, filed on Feb. 20, 2020 and Ser. No. 63/003,255, filed Mar. 31, 2020. The entirety of the above-mentioned patent application is hereby incorporated by reference herein and made a part of this specification.

BACKGROUND

Technical Field

The present disclosure generally relates to a touch integrated display device.

Description of Related Art

Presently, touch display panels are widely equipped in various electronic devices such as mobile phones and tablet computers, to allow manipulation of the devices through touch sensing.

Accordingly, a touch integrated display device obtained by integration of touch components and display panels begin to enter into the markets. The touch components may be integrated into a display panel through methods such as in-cell, on-cell, One Glass Solution (OGS), Glass/Glass (G/G), Glass/Film (GFF), and so on.

In accordance with the on-cell solution, the touch component is integrated at the inside of package cover, and thus this solution may reduce the thickness of the display panel as compared with the G/G solution. However, in this solution, touch signals from touch traces and image display signals from source/gate traces would interfere with one another, especially in the fan out area, which results in poor touch sensitivity and display effect of the touch integrated display device.

SUMMARY

Accordingly, the present disclosure is directed to a touch integrated display device, which can reduce the interference between the touch signals and the image display signals.

The present disclosure is directed to a touch integrated display device including a substrate, at one metal layer, a touch sensor and trace layer, and a shielding layer. The substrate includes an active area and a fan out area neighboring to the active area. The metal layer is disposed over the substrate in the active area and extended to the fan out area, wherein the at least one metal layer includes a plurality of source lines and a plurality of gate lines. The touch sensor and trace layer are disposed over the at least one metal layer in the active area and extended to the fan out area. The shielding layer is interposed between the at least one metal layer and the touch sensor and trace layer, wherein the shielding layer is at least disposed at an overlap region of the fan out area where the at least one metal layer and the touch sensor and trace layer are overlapped from a top view.

According to an embodiment of the present disclosure, the touch integrated display device further includes a gate insulating layer interposed between the at least one metal layer and the touch sensor and trace layer for electrical insulation.

According to an embodiment of the present disclosure, the shielding layer is a cathode layer located on the active area and the fan out area, wherein the cathode layer is interposed between the at least one metal layer and the touch sensor and trace layer to be served as the shielding layer.

According to an embodiment of the present disclosure, the cathode layer is continuously extended from the active area to the fan out area to be served as the shielding layer.

According to an embodiment of the present disclosure, the cathode layer has a first portion in the active area and a second portion in the fan out area and the first portion and the second portion are separated from each other.

According to an embodiment of the present disclosure, the cathode layer is disposed between the gate insulating layer and the touch sensor and trace layer.

According to an embodiment of the present disclosure, the touch integrated display device further includes a packaging layer located in the active area and disposed between the touch sensor and trance layer and the cathode layer.

According to an embodiment of the present disclosure, the touch integrated display device further includes a second package or insulating layer located in the fan out area and disposed between the touch sensor and trance layer and the cathode layer.

According to an embodiment of the present disclosure, the shielding layer includes a material different from a material of the cathode layer.

According to an embodiment of the present disclosure, the gate insulating layer includes two layers and the shielding layer is disposed between the two layers of the gate insulating layer. as an inserted layer.

According to an embodiment of the present disclosure, a material of the shielding layer includes metal.

According to an embodiment of the present disclosure, a material of the shielding layer includes indium tin oxide (ITO).

According to an embodiment of the present disclosure, the shielding layer is a solid metal layer.

According to an embodiment of the present disclosure, the shielding layer is a patterned metal layer.

According to an embodiment of the present disclosure, the gate insulating layer is disposed on the active area and extended to the fan out area.

According to an embodiment of the present disclosure, the shielding layer is electrically connected to a reference voltage or electrically floating.

According to an embodiment of the present disclosure, the touch sensor and trace layer includes a plurality of touch traces extended from the active area to the fan out area, and at least one of the plurality of touch traces has a turning portion in the active area such that the at least one touch trace is extended into two opposite peripheral regions of the fan out area.

According to an embodiment of the present disclosure, the touch sensor and trace layer includes an array of touch sensors disposed on the active area, the plurality of touch traces connected to the array of touch sensors and extended to the fan out area.

According to an embodiment of the present disclosure, the array of touch sensors is in grid pattern or diamond pattern.

According to an embodiment of the present disclosure, the touch integrated display device further includes a chip disposed on the substrate and coupled to the at least one metal layer and the touch sensor and trace layer.

According to an embodiment of the present disclosure, the touch integrated display device is a touch integrated organic light-emitting diode (OLED) display device.

The present disclosure is directed to a touch integrated display device including a substrate, at one metal layer, a touch sensor and trace layer. The substrate includes an active area and a fan out area neighbouring to the active area. The metal layer is disposed over the substrate in the active area and extended to the fan out area, wherein the at least one metal layer includes a plurality of source lines and a plurality of gate lines. The touch sensor and trace layer are disposed over the at least one metal layer in the active area and extended to the fan out area. The touch sensor and trace layer include a plurality of touch traces extended from the active area to the fan out area, and at least one of the plurality of touch traces has a turning portion in the active area such that the at least one touch trace is extended into two opposite peripheral regions of the fan out area.

According to an embodiment of the present disclosure, the touch integrated display device further includes a gate insulating layer interposed between the at least one metal layer and the touch sensor and trace layer for electrical insulation.

According to an embodiment of the present disclosure, the touch sensor and trace layer includes an array of touch sensors disposed on the active area, the plurality of touch traces connected to the array of touch sensors and extended to the fan out area.

According to an embodiment of the present disclosure, the array of touch sensors is in grid pattern or diamond pattern.

According to an embodiment of the present disclosure, the touch integrated display device further includes a chip disposed on the substrate and coupled to the at least one metal layer and the touch sensor and trace layer.

According to an embodiment of the present disclosure, the touch integrated display device is a touch integrated organic light-emitting diode (OLED) display device.

In light of the foregoing, the shielding layer is adopted in the touch integrated display device, to be at least disposed at the overlap region of the fan out area where the metal layer and the touch sensor and trace layer are overlapped from a top view, and is configured to shield electromagnetic interference between the metal layer and the touch sensor and trace layer.

Moreover, at least one touch traces of the touch sensor and trace layer has at least one turning portion in the active area. Accordingly, the touch traces having the turning portions are extended into two opposite peripheral regions of the fan out area, so as to gather in the peripheral regions instead of spreading throughout the fan out area. Thereby, the area of the overlap region where the metal layer and the touch sensor and trace layer are overlapped from a top view can be reduced, so as to further reduce the interference between the metal layer and the touch sensor and trace layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 3 illustrates a schematic cross sectional view of a touch integrated display device according to another one of the embodiments of the disclosure.

FIG. 4 illustrates a schematic cross sectional view of a touch integrated display device according to yet another one of the embodiments of the disclosure.

DESCRIPTION OF THE EMBODIMENTS

Figure 1:
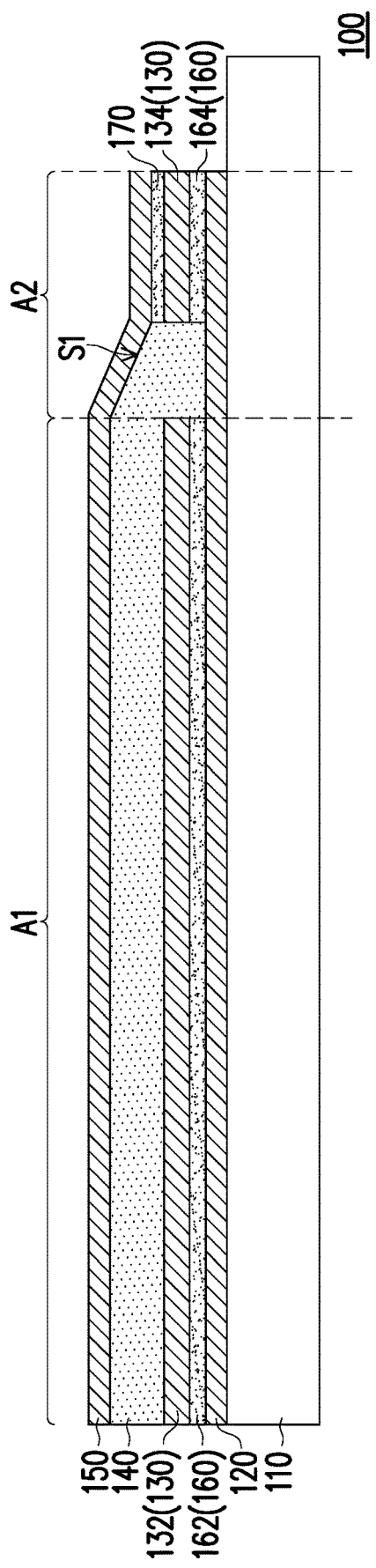
FIG. 1 illustrates a schematic cross sectional view of a touch integrated display device according to one of the embodiments of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

The present disclosure will now be described more fully with reference to the accompanying drawings, in which exemplary embodiments of the invention are shown. The terms used herein such as "on", "above", "below", "front", "back", "left" and "right" are for the purpose of describing directions in the figures only and are not intended to be limiting of the invention. Moreover, in the following embodiments, the same or similar reference numbers denote the same or like components.

Figure 2:
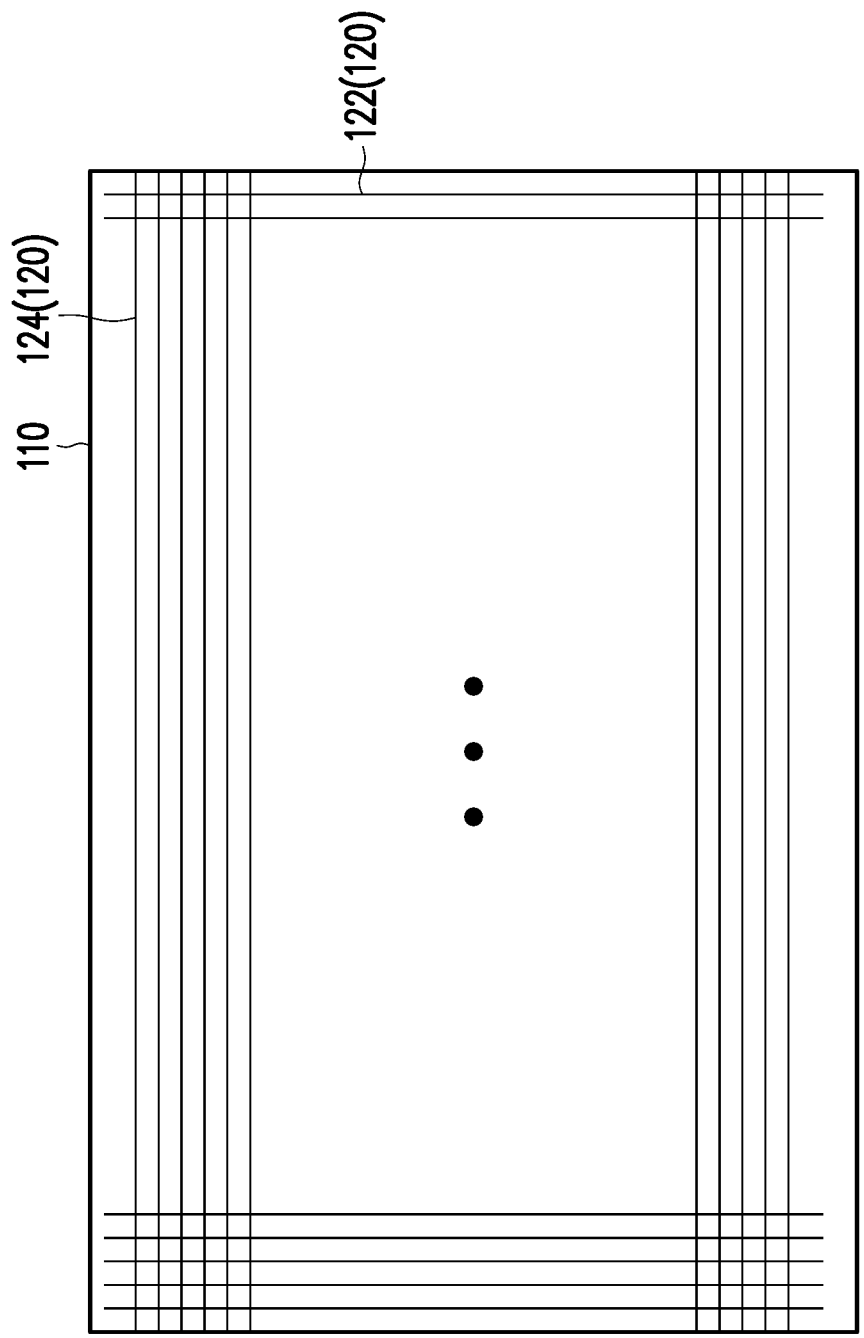
FIG. 2 illustrates a schematic plan view of a metal layer of a touch integrated display device according to one of the embodiments of the disclosure.

FIG. 1 illustrates a schematic cross sectional view of a touch integrated display device according to one of the embodiments of the disclosure. FIG. 2 illustrates a schematic plan view of a metal layer of a touch integrated display device according to one of the embodiments of the disclosure. Referring to FIG. 1 and FIG. 2, in some embodiments, the touch integrated display device 100 includes a substrate 110, at one metal layer 120, a touch sensor and trace layer 150, and a shielding layer 130. According to embodiments of the present disclosure, this disclosure relates generally to a touch integrated display device such as a touch sensor and trace layer integrated with or in direct physical contact with a display structure such as an organic light emitting diode (OLED) structure in a module or integrated circuit (IC). In some embodiments, the touch integrated display device 100 is a touch integrated organic light-emitting diode (OLED) display device. However, the disclosure is not limited thereto.

In some embodiments, the substrate 110 includes an active area A1 and a fan out area A2 neighbouring to the active area A. The substrate 110 may be made of a glass, a polyimide, or the like. In some embodiments, the active area A1 may be, for example, a rectangular region disposed in the center of the substrate 110 in which display pixels are actively used to display images for a user of the touch integrated display device 100. The fan out area A2 may be devoid of active display pixels. In the present embodiment, the fan out area A2 may has the shape of a rectangular ring, surrounding the periphery of active area A1. However, the disclosure does not limit shapes and layout of the areas on substrate 110.

In some embodiments, the metal layer 120 may be provided over the substrate 110. It is noted that the metal layer 120 in FIG. 1 is illustrated in an abstract form as a layer for convenience of illustration. In some embodiments, the metal layer 120 may include a plurality of source lines 122 and a plurality of gate lines 124 as shown in FIG. 2. For example, the gate lines 124 extend from one end to the other end of the substrate 110 along a first direction (e.g., X-direction). The gate lines 124 are separated at a constant distance and substantially parallel to one another. Furthermore, the source lines 122 (i.e., data lines) are provided over the substrate 110 to extend along a second direction (e.g., Y-direction) intersecting with the first direction. The region defined by a gate line 124 and a source line 122 forms one pixel. Each pixel corresponds to one of the colours of the color filters. The metal layer 120 including the source lines 122 and the gate lines 124) are extended from the active area A to the fan out area A2.

In accordance to some embodiments of the disclosure, the touch sensor and trace layer 150 is disposed over the metal layer 120 in the active area A1 and extended to the fan out area A2. In this context, a touch sensor and trace layer 150 may refer to a configuration of touch sensors and traces, including a surface, in which touch sensors and traces of the configuration are responsive to direct physical contact with (e.g., touching) or close proximity to the surface of the configuration or a portion thereof. It is noted also that the terms "touch sensor and trace layer" may be referred to a touch actuated sensor configuration, touch activated sensor configuration, touch panel, touch sensor panel, touch sensing structure, and touch sensor configuration, which may be used interchangeably throughout this specification.

In accordance to some embodiments of the disclosure, the touch sensor and trace layer 150 may include a plurality of touch driving lines, a plurality of touch sensing lines and a plurality of touch sensing electrodes. It is noted that the touch sensor and trace layer 150 in FIG. 1 is illustrated in an abstract form as a layer for convenience of illustration. In some embodiments, the touch driving lines and the touch sensing lines have the similar structures and may realize interchangeable functions. According to the embodiments of the present disclosure, the touch sensor and trace layer 150 can be roughly arranged in an on-cell type in which the touch sensor and trace layer 150 is disposed over a display structure (panel) including the metal layer 120. In some embodiments, the touch sensor and trace layer 150 may include the touch driving lines formed of grouped-together circuit elements of a thin film transistor layer and touch sensing lines formed in layer external to the metal layer 120 in a stack-up manner.

In some embodiments, the shielding layer 130 is disposed on the fan out area A2 and interposed between the metal layer 120 and the touch sensor and trace layer 150. In accordance to some embodiments of the disclosure, the shielding layer 130 is at least disposed at an overlap region of the fan out area A1 where the metal layer 120 and the touch sensor and trace layer 150 are overlapped from a top view and is configured to shield electromagnetic interference between the metal layer 120 and the touch sensor and trace layer 150. In some embodiments, the shielding layer 130 has a first portion 132 in the active area A1 and a second portion 134 in the fan out area A2. The first portion 132 and the second portion 134 are separated (spaced apart) and electrically insulated from each other. In other words, the first portion 132 and the second portion 134 are two separated and independent shielding patterns. In some embodiments, these two separated and independent shielding patterns 132 and 134 may be formed on the same level and formed in the same process, for example, lithography, etc. In an alternative embodiment, the first portion 132a and the second portion 134a may be formed in two separate and independent steps. The disclosure is not limited thereto. In other embodiments, the shielding layer may be a continuous layer extended from the active area A1 to the fan out area A2 as the shielding layer 130' shown in FIG. 3.

In accordance to some embodiments of the disclosure, the shielding layer 130 may include conductive material such as metal. In one of the implementations, the shielding layer 130 may be a layer of conductive transparent material such as indium tin oxide (ITO), or other suitable conductive material. In the present embodiment, the shielding layer 130 is composed of a material different from a material of the cathode layer (i.e., cathode material). The shielding layer 130 may be deposited using physical vapor deposition or other deposition techniques. In the present embodiment, the shielding layer 130 is a solid metal layer. In an alternative embodiment, the shielding layer may be a patterned metal layer, for example, a metal mesh.

The presence of the shielding layer (conductive layer) 130 between the metal layer 120 and the touch sensor and trace layer 150 may help block interference that is present in the touch sensor and trace layer 150 from reaching the metal layer 120 in display structure and may help block interference signals that are generated by the metal layer 120 from reaching touch sensor circuitry on the touch sensor and trace layer 150 in touch sensing structure. In some embodiments, the shielding layer 130 may provide effective shielding when it is electrically connected to a reference voltage (grounding), or electrically floating. With one suitable arrangement, grounding structures may be used to couple the shielding layer 130 to ground traces and thereby couple the shielding layer 130 to the ground.

In some embodiments, the touch integrated display device 100 may further include a gate insulation layer 160 interposed between the metal layer 120 and the touch sensor and trace layer 150 for electrical insulation. Specifically, in one of the implementations, the gate insulation layer 160 is interposed between the metal layer 120 and the shielding layer 130 for electrical insulation. In one of the implementations, the gate insulation layer 160 may include an active portion 162 disposed between the metal layer 120 and the first portion 132 of the shielding layer 130 and a fan out portion 164 disposed between the metal layer 120 and the second portion 134 of the shielding layer 130. In some embodiments, the gate insulating layer 160 may be a gate oxide. The gate oxide may be an insulating material formed by processes such as LPCVD, PECVD, HDPCVD, UHVCVD, MOCVD, MBE, ALD, evaporation, (magnetic) sputtering and the like. The gate oxide may be made of a material such as a silica or a high k material, etc.

In some embodiments, the touch integrated display device 100 may further include a packaging layer 140 located on the active area A1 and disposed between the touch sensor and trance layer 150 and the shielding layer 130. The packaging layer 140 is configured to prevent the permeation of water, oxygen and other ingredients. The packaging layer 140 may be formed by the combination of an inorganic layer and an organic layer. In some embodiments, the packaging layer 140 may be at least partially extended to the fan out area A2 and fill the gap between the first portion 132 and the second portion 134 of the shielding layer 130. In other words, the first portion 132 and the second portion 134 are spaced apart and insulated from each other by the packaging layer 140. The packaging layer 140 may further fill the gap between the active portion 162 of the gate insulation layer 160 and the fan out portion 164 of the gate insulation layer 160. The part of the packaging layer 140 that is extended to the fan out area A2 may have an inclined surface S1, which means the thickness of the packaging layer 140 in the fan out area A2 gradually decreases along the direction away from the active area A1. Thereby, the touch sensor and trace layer 150 disposed on the packaging layer 140 can gradually lower its height along the inclined surface S1 without a height drop due to sudden loss of the packaging layer 140 in the fan out area A2. In some embodiments, the touch integrated display device 100 may further include another packaging layer or an insulating layer 170 located in the fan out area A2 and disposed between the touch sensor and trace layer 150 and the second portion 134 of the shielding layer 130.

FIG. 3 illustrates a schematic cross sectional view of a touch integrated display device according to another one of the embodiments of the disclosure. It is noted that the touch integrated display device 100*a* shown in FIG. 3 contains many features same as or similar to the touch integrated display device 100 disclosed earlier with FIG. 1 and FIG. 2. For purpose of clarity and simplicity, detail description of same or similar features may be omitted, and the same or similar reference numbers denote the same or like components. The main differences between the touch integrated display device 100*a* shown in FIG. 3 and touch integrated display device 100 disclosed earlier with FIG. 1 and FIG. 2 are described as follows.

Referring to FIG. 3, in accordance to some embodiments of the disclosure, the shielding layer may be a cathode layer 130*a* located on the active area A1 and the fan out area A2. The cathode layer 130*a* is interposed between the metal layer 120 and the touch sensor and trace layer 150 to be served as a shielding layer 130 disclosed earlier with FIG. 1. Accordingly, the configuration of the cathode layer 130*a* may be the same or at least similar to the shielding layer 130 in the previous embodiments. The cathode layer 130*a* interposed between the metal layer 120 and the touch sensor and trace layer 150 may help block interference that is present in the touch sensor and trace layer 150 from reaching the metal layer 120 in display structure and may help block interference signals that are generated by the metal layer 120 from reaching touch sensor circuitry on the touch sensor and trace layer 150 in touch sensing structure. Accordingly, the cathode layer 130*a* can contain circuit elements that act as cathodes to a(n) (OLED) display structure during a display mode of the device 100*a* and also act as shielding layer for blocking interference between the metal layer 120 and the touch sensor and trace layer 150.

In some embodiments, the cathode layer 130*a* needs to supply electrons and is made of a material having high electric conductivity and a low work function, that is, a cathode material. Cathode materials may be comprised of cobalt, nickel and manganese in the crystal structure forming a multi-metal oxide material to which lithium is added. In the present embodiment, the cathode layer 130*a* has a first portion 132*a* in the active area A1 and a second portion 134*a* in the fan out area A2. The first portion 132*a* and the second portion 134*a* are separated (spaced apart) and electrically insulated from each other by the packaging layer 140. In other words, the first portion 132*a* and the second portion 134*a* are two separated and independent shielding patterns. In some embodiments, these two separated and independent first portion 132*a* and the second portion 134*a* may be formed on the same level and formed in the same process, for example, lithography, etc. In other embodiments, the first portion 132*a* and the second portion 134*a* may be formed in two separate and independent steps. The disclosure is not limited thereto. In some embodiments, the cathode layer 130*a* is disposed between the gate insulating layer 160 (including the active portion 162 and the fan out portion 164) and the touch sensor and trace layer 150. The packaging layer 140 is located in the active area A1 and disposed between the touch sensor and trance layer 150 and the cathode layer 130*a*. In some embodiments, the packaging layer 140 may be at least partially extended to the fan out area A2 and fill the gap between the first portion 132*a* and the second portion 134*a* of the cathode layer 130. In other words, the first portion 132*a* and the second portion 134*a* are spaced apart and insulated from each other by the packaging layer 140. The packaging layer 140 may further fill the gap between the active portion 162 and the fan out portion 164 of the gate insulation layer 160. In some embodiments, the touch integrated display device 100 may further include another packaging layer or an insulating layer 170 located in the fan out area A2 and disposed between the touch sensor and trace layer 150 and the second portion 134 of the cathode layer 130*a*.

FIG. 4 illustrates a schematic cross sectional view of a touch integrated display device according to yet another one of the embodiments of the disclosure. It is noted that the touch integrated display device 100' shown in FIG. 4 contains many features same as or similar to the touch integrated display devices disclosed earlier. For purpose of clarity and simplicity, detail description of same or similar features may be omitted, and the same or similar reference numbers denote the same or like components. The main differences between the touch integrated display device 100' shown in FIG. 4 and the touch integrated display devices disclosed earlier in the previous embodiments are described as follows.

With now reference to FIG. 4, in some embodiments, the shielding layer 130' may be continuously extended from the active area A1 to the fan out area A2. In some embodiments, the shielding layer 130' is continuously interposed between the metal layer 120 and the touch sensor and trace layer 150 for shielding electromagnetic interference between the metal layer 120 and the touch sensor and trace layer 150. Accordingly, in the present embodiment, the gate insulation layer 160' interposed between the metal layer 120 and the touch sensor and trace layer 150 may also be a continuous insulation layer extended from the active area A1 to the fan out area A2. Specifically, in one of the implementations, the gate insulation layer 160' is continuously interposed between the metal layer 120 and the shielding layer 130 for electrical insulation. The presence of the shielding layer (conductive layer) 130' between the metal layer 120 and the touch sensor and trace layer 150 may help block interference between the touch sensor and trace layer 150 and the metal layer 120. In some embodiments, the shielding layer 130' may provide effective shielding when grounded to a ground. With one suitable arrangement, grounding structures may be used to couple the shielding layer 130' to ground traces and thereby couple the shielding layer 130' to the ground.

In some embodiments, the cathode layer 130*a*' may be served as the shielding layer described above. Namely, the cathode layer 130*a*' formed of cathode material may be substituted for the shielding layer 130'. Accordingly, the cathode layer 130*a*' is continuously extended from the active area A1 to the fan out area A2. Accordingly, the configuration of the cathode layer 130*a*' may be the same or at least similar to the shielding layer 130 in the previous embodiments. In some embodiments, the cathode layer 130*a*' is continuously interposed between the metal layer 120 and the touch sensor and trace layer 150 to be served as the shielding layer 130' for shielding electromagnetic interference between the metal layer 120 and the touch sensor and trace layer 150. The cathode layer 130*a*' can contain circuit elements that act as cathodes to a(n) (OLED) display structure during a display mode of the device 100' and also act as shielding layer for blocking interference between the metal layer 120 and the touch sensor and trace layer 150.

Figure 5:
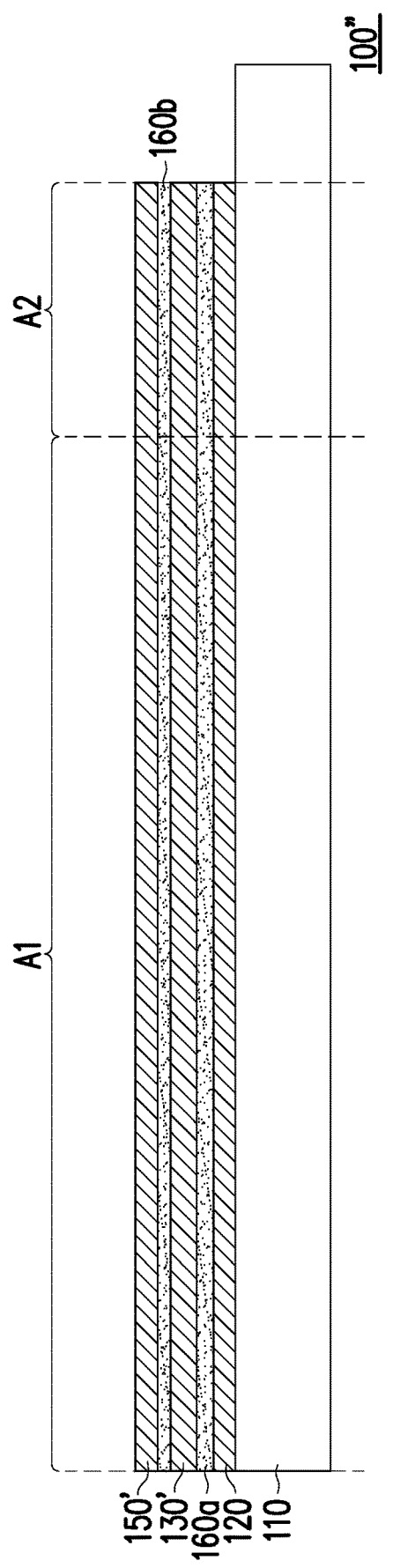
FIG. 5 illustrates a schematic cross sectional view of a touch integrated display device according to yet another one of the embodiments of the disclosure.

FIG. 5 illustrates a schematic cross sectional view of a touch integrated display device according to yet another one of the embodiments of the disclosure. It is noted that the touch integrated display device 100" shown in FIG. 5 contains many features same as or similar to the touch integrated display devices disclosed earlier. For purpose of clarity and simplicity, detail description of same or similar features may be omitted, and the same or similar reference numbers denote the same or like components. The main differences between the touch integrated display device 100" shown in FIG. 5 and the touch integrated display devices disclosed earlier in the previous embodiments are described as follows.

Referring to FIG. 5, in accordance to some embodiments of the disclosure, the gate insulating layer may include two layers of the gate insulating layers 160*a*, 160*b*, and the shielding layer 130' (or the cathode layer 130*a*') is disposed between the gate insulating layers 160*a* and 160*b* as an inserted layer. For example, the gate insulating layer 160*a* may be the lower gate insulating layer and disposed between the metal layer 120 and the shielding layer 130' (or the cathode layer 130*a*'), while the gate insulating layer 160*b* may be the upper gate insulating layer and disposed over the shielding layer 130' (or the cathode layer 130*a*'). Accordingly, the touch sensor and trace layer 150 is disposed over the gate insulating layer 160*b*. In some embodiments, both of the gate insulating layers 160*a* and 160*b* may be gate oxide. The gate oxide may be an insulating material formed by processes such as LPCVD, PECVD, HDPCVD, UHVCVD, MOCVD, MBE, ALD, evaporation, (magnetic) sputtering and the like. The gate oxide may be made of a material such as a silica or a high k material, etc. The disclosure is not limited thereto.

Figure 6:
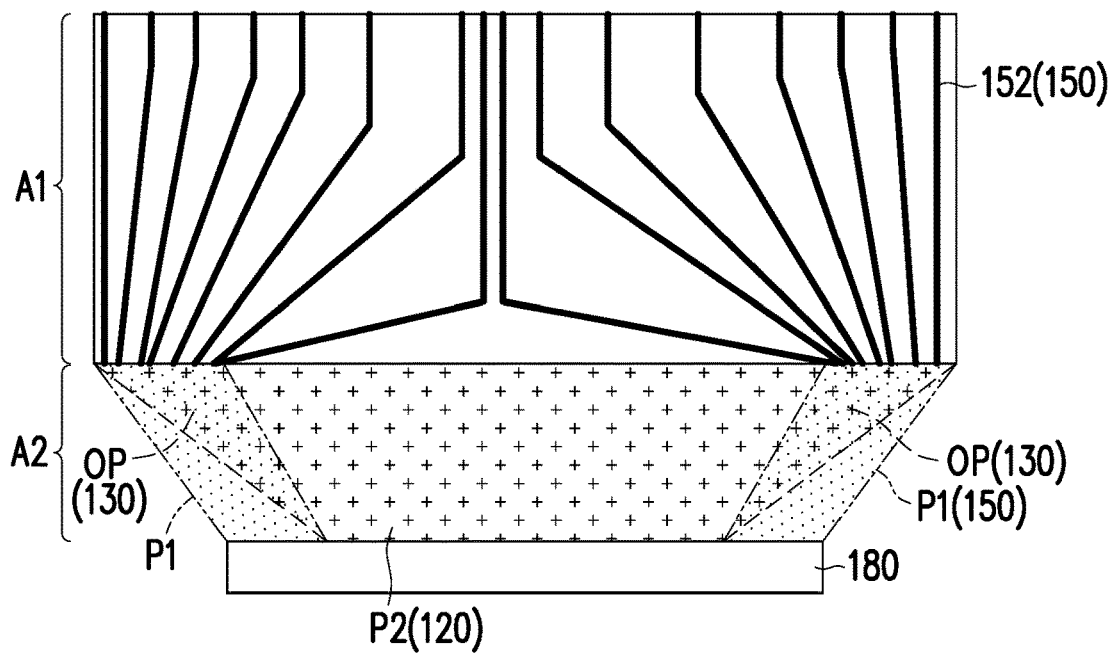
FIG. 6 illustrates a schematic partial top view of a touch integrated display device according to one of the embodiments of the disclosure.
Figure 7:
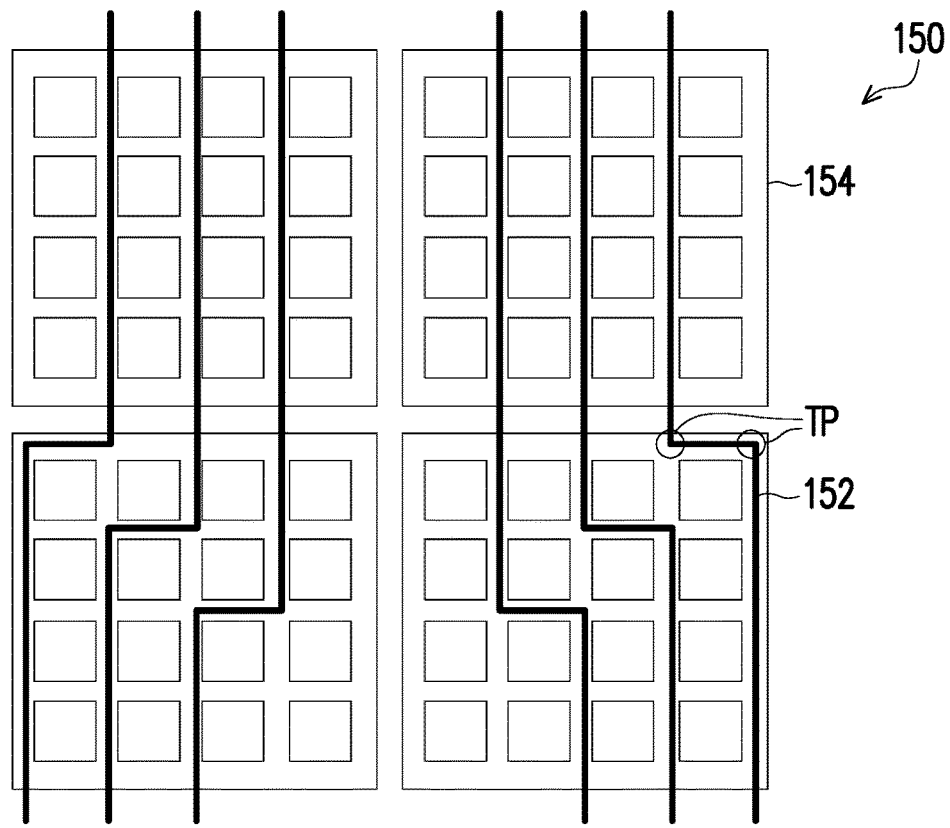
FIG. 7 illustrates a schematic partial enlarged view of a touch integrated display device according to one of the embodiments of the disclosure.

FIG. 6 illustrates a schematic partial top view of a touch integrated display device according to one of the embodiments of the disclosure. FIG. 7 illustrates a schematic partial enlarged view of a touch integrated display device according to one of the embodiments of the disclosure. It is noted that the touch integrated display device shown in FIG. 6 and FIG. 7 contains many features same as or similar to the touch integrated display devices disclosed earlier. For purpose of clarity and simplicity, detail description of same or similar features may be omitted, and the same or similar reference numbers denote the same or like components. The main differences between the touch integrated display device shown in FIG. 6 and FIG. 7 and the touch integrated display devices disclosed earlier in the previous embodiments are described as follows.

With now reference to FIG. 6 and FIG. 7, in some embodiments, the touch sensor and trace layer 150 includes a plurality of touch traces 152 and an array of touch sensors 154. The array of touch sensors 154 is disposed on the active area A1, and the touch traces 152 are connected to the array of touch sensors 154 and extended to the fan out area A2. In some embodiments, the touch traces 152 are extended from the active area A1 to the fan out area A2. In one of the implementations, the touch sensors 154 may be positioned in columns and rows so as to form in grid pattern with each touch sensor (electrode) representing a different X, Y coordinate. In some embodiments, the touch integrated display device may further include a chip 180 disposed on the substrate 110 and coupled to the metal layer 120 and the touch sensor and trace layer 150. In some embodiments, the chip 180 is a driver IC for driving the touch integrated display device.

In some embodiments, at least one of the touch traces 152 has at least one turning portion TP in the active area A1, such that the touch trace 152 having the turning portion TP is changed in direction and extended into two opposite peripheral regions P1 of the fan out area A2. That is, at least some of the touch trace 152 (e.g., ones that are located on the central part of the substrate 110) are making a turn toward the peripheral regions P1 of the fan out area A2. In the present embodiment, the touch trace 152 may follow the grid pattern of the touch sensors 154 to change in direction as it is shown in right part of FIG. 7. On the other hand, the metal layer 120, without changing in directions, may be extended to the fan out area A2 and distributed over the fan out region P2, which is the typical fan out region for traces without changing in directions. The touch trace 152 that are extended to the fan out area A2 are gathered in the peripheral regions P1 located on two opposite sides of the fan out area A2 instead of spreading throughout the fan out region P2 of the fan out area A2. Thereby, the area of the overlap region OP where the metal layer 120 and the touch sensor and trace layer 150 (e.g., the touch traces 152) are overlapped from a top view can be reduced, so as to further reduce the interference between the metal layer 120 and the touch sensor and trace layer 150. In some embodiments, the shielding layer 130 (or the cathode layer 130*a*) may be disposed on the overlap region OP to be interposed between the metal layer 120 and the touch sensor and trace layer 150 that are overlapped from a top view.

Figure 8:
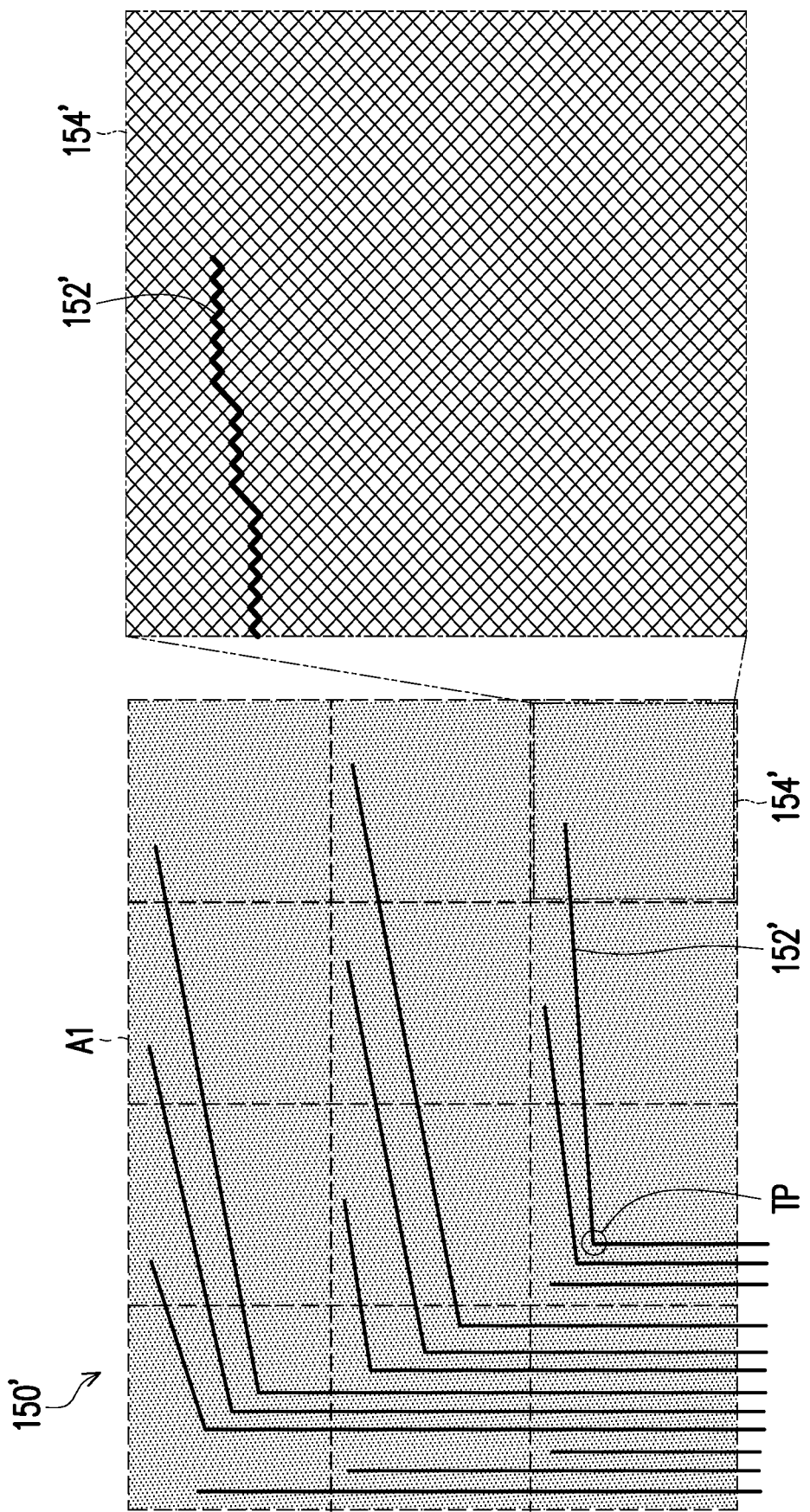
FIG. 8 illustrates a schematic partial enlarged view of a touch integrated display device according to one of the embodiments of the disclosure.

FIG. 8 illustrates a schematic partial enlarged view of a touch integrated display device according to one of the embodiments of the disclosure. It is noted that the touch integrated display device shown in FIG. 8 contains many features same as or similar to the touch integrated display devices disclosed earlier. For purpose of clarity and simplicity, detail description of same or similar features may be omitted, and the same or similar reference numbers denote the same or like components. The main differences between the touch integrated display device shown in FIG. 8 and the touch integrated display devices disclosed earlier in the previous embodiments are described as follows.

It is noted that the arrangement of the touch sensors 154 shown in FIG. 7 is merely an exemplary arrangement. Other arrangements may also be used, for example a diamond arrangement of the touch sensors 154' shown in FIG. 8. Accordingly, FIG. 8 illustrates another embodiment to achieve the change in directions of the touch traces in the device shown in, for example, FIG. 6. With now reference to FIG. 6 and FIG. 8, in some embodiments, the touch sensor and trace layer 150' includes a plurality of touch traces 152' and an array of touch sensors 154'. The array of touch sensors 154' is disposed on the active area A1, and the touch traces 152' are connected to the array of touch sensors 154' and extended from the active area A1 to the fan out area A2. In one of the implementations, as it is shown in FIG. 8, the array of the touch sensors 154' may be in diamond pattern in which a change of capacitance occurs between two neighboring diamond-shaped fields when a user approaches or touches the array of the touch sensors 154'. The diamond-shaped fields may also be coupled in rows and columns.

In some embodiments, at least one of the touch traces 152' has at least one turning portion TP in the active area A1, such that the touch trace 152' having the turning portion TP is changed in direction and extended into two opposite peripheral regions P1 of the fan out area A2. That is, at least some of the touch trace 152' (e.g., ones that are located on the central part of the substrate 110) are making a turn toward the peripheral regions P1 of the fan out area A2. In the present embodiment, the touch trace 152' may follow the diamond pattern of the touch sensors 154' to change in direction as it is shown in right part of FIG. 8. Accordingly, the touch trace 152' that are extended to the fan out area A2 are gathered in the peripheral regions P1 located on two opposite sides of the fan out area A2 instead of spreading throughout the fan out region P2 of the fan out area A2. Thereby, the area of the overlap region OP where the metal layer 120 and the touch sensor and trace layer 150 (e.g., the touch traces 152) are overlapped from a top view can be reduced, so as to further reduce the interference between the metal layer 120 and the touch sensor and trace layer 150. In some embodiments, the shielding layer 130 (or the cathode layer 130a) may be disposed on the overlap region OP to be interposed between the metal layer 120 and the touch sensor and trace layer 150 that are overlapped from a top view to further reduce the interference between the metal layer 120 and the touch sensor and trace layer 150.

Based on the above discussions, it can be seen that the present disclosure offers various advantages. It is understood, however, that not all advantages are necessarily discussed herein, and other embodiments may offer different advantages, and that no particular advantage is required for all embodiments.

In sum, in the touch integrated display device, the shielding layer is at least disposed at the overlap region of the fan out area where the metal layer and the touch sensor and trace layer are overlapped from a top view, and is configured to shield electromagnetic interference between the metal layer and the touch sensor and trace layer. Moreover, at least one touch traces of the touch sensor and trace layer has at least one turning portion in the active area. Accordingly, the touch traces having the turning portions are extended into two opposite peripheral regions of the fan out area, so as to gather in the peripheral regions instead of spreading throughout the fan out area. Thereby, the area of the overlap region where the metal layer and the touch sensor and trace layer are overlapped from a top view can be reduced, so as to further reduce the interference between the metal layer and the touch sensor and trace layer.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A touch integrated display device, comprising:
a substrate comprising an active area and a fan out area neighbouring to the active area;
at least one metal layer disposed over the substrate in the active area and extended to the fan out area, wherein the at least one metal layer comprises a plurality of source lines and a plurality of gate lines;
a touch sensor and trace layer disposed over the at least one metal layer in the active area and extended to the fan out area; and
a shielding layer interposed between the at least one metal layer and the touch sensor and trace layer, wherein the shielding layer is at least disposed at an overlap region of the fan out area where the at least one metal layer and the touch sensor and trace layer are overlapped from a top view.

2. The touch integrated display device according to claim 1, further comprising a gate insulating layer interposed between the at least one metal layer and the touch sensor and trace layer for electrical insulation.

3. The touch integrated display device according to claim 2, wherein the shielding layer is a cathode layer located on the active area and the fan out area, wherein the cathode layer is interposed between the at least one metal layer and the touch sensor and trace layer.

4. The touch integrated display device according to claim 3, wherein the cathode layer is continuously extended from the active area to the fan out area.

5. The touch integrated display device according to claim 3, wherein the cathode layer has a first portion in the active area and a second portion in the fan out area and the first portion and the second portion are separated from each other.

6. The touch integrated display device according to claim 3, wherein the cathode layer is disposed between the gate insulating layer and the touch sensor and trace layer.

7. The touch integrated display device according to claim 3, further comprising a packaging layer located in the active area and disposed between the touch sensor and trace layer and the cathode layer.

8. The touch integrated display device according to claim 3, further comprising a packaging layer or an insulating layer located in the fan out area and disposed between the touch sensor and trace layer and the cathode layer.

9. The touch integrated display device according to claim 3, wherein the shielding layer comprises a material different from a material of the cathode layer.

10. The touch integrated display device according to claim 9, wherein the gate insulating layer comprises two layers and the shielding layer is disposed between the two layers of the gate insulating layer as an inserted layer.

11. The touch integrated display device according to claim 1, wherein a material of the shielding layer comprises metal.

12. The touch integrated display device according to claim 1, wherein a material of the shielding layer comprises indium tin oxide (ITO).

13. The touch integrated display device according to claim 11, wherein the shielding layer is a solid metal layer.

14. The touch integrated display device according to claim 11, wherein the shielding layer is a patterned metal layer.

15. The touch integrated display device according to claim 2, wherein the gate insulating layer is disposed on the active area and extended to the fan out area.

16. The touch integrated display device according to claim 1, wherein the shielding layer is electrically connected to a reference voltage or electrically floating.

17. The touch integrated display device according to claim 1, wherein the touch sensor and trace layer comprises a plurality of touch traces extended from the active area to the fan out area, and at least one of the plurality of touch traces has a turning portion in the active area such that the at least one touch trace is extended into two opposite peripheral regions of the fan out area.

18. The touch integrated display device according to claim 17, wherein the touch sensor and trace layer comprises an array of touch sensors disposed on the active area, the plurality of touch traces connected to the array of touch sensors and extended to the fan out area.

19. The touch integrated display device according to claim 18 wherein the array of touch sensors is in grid pattern or diamond pattern.

20. The touch integrated display device according to claim 1, further comprising a chip disposed on the substrate and coupled to the at least one metal layer and the touch sensor and trace layer.

21. The touch integrated display device according to claim 1, wherein the touch integrated display device is a touch integrated organic light-emitting diode (OLED) display device.

22. A touch integrated display device, comprising:
   a substrate comprising an active area and a fan out area neighbouring to the active area;
   at least one metal layer disposed over the substrate in the active area and extended to the fan out area, wherein the at least one metal layer comprises a plurality of source lines and a plurality of gate lines;
   a touch sensor and trace layer disposed over the at least one metal layer in the active area and extended to the fan out area; and
   wherein the touch sensor and trace layer comprises a plurality of touch traces extended from the active area to the fan out area, and at least one of the plurality of touch traces has a turning portion in the active area such that the at least one touch trace is extended into two opposite peripheral regions of the fan out area.

23. The touch integrated display device according to claim 22, further comprising
   a gate insulating layer interposed between the at least one metal layer and the touch sensor and trace layer for electrical insulation.

24. The touch integrated display device according to claim 22, wherein the touch sensor and trace layer comprises an array of touch sensors disposed on the active area, the plurality of touch traces connected to the array of touch sensors and extended to the fan out area.

25. The touch integrated display device according to claim 24, wherein the array of touch sensors is in grid pattern or diamond pattern.

26. The touch integrated display device according to claim 22, further comprising a chip disposed on the substrate and coupled to the at least one metal layer and the touch sensor and trace layer.

27. The touch integrated display device according to claim 22, wherein the touch integrated display device is a touch integrated organic light-emitting diode (OLED) display device.

* * * * *